United States Patent [19]

Harada et al.

[11] 4,367,492

[45] Jan. 4, 1983

[54] SOLID STATE IMAGE SENSOR

[75] Inventors: Nozomu Harada, Yokohama; Akihiko Furukawa, Tokyo; Yukio Endo; Okio Yoshida, both of Yokohama, all of Japan

[73] Assignee: Tokyo Shibaura Denki Kabushiki Kaisha, Kawasaki, Japan

[21] Appl. No.: 212,434

[22] Filed: Dec. 3, 1980

[30] Foreign Application Priority Data

Dec. 7, 1979 [JP] Japan .................. 54-157980

[51] Int. Cl.³ .................. H04N 9/07; H04N 3/14
[52] U.S. Cl. .................. 358/213; 358/43; 358/44
[58] Field of Search .................. 358/41, 43, 44, 212, 358/213; 357/24, 30; 250/570, 211 J

[56] References Cited

U.S. PATENT DOCUMENTS

| | | | |
|---|---|---|---|
| 4,117,510 | 9/1978 | Ohta | 358/44 |
| 4,200,892 | 4/1980 | Weimer | 358/44 |
| 4,263,620 | 4/1981 | Felix | 358/213 |
| 4,281,338 | 7/1981 | Takahashi | 358/44 |
| 4,300,163 | 11/1981 | Wada | 358/213 |

OTHER PUBLICATIONS

"The Resistive Gate CTD Area-Image Sensor", Heyns et al., Feb. 1978, IEEE Transactions on Electron Devices, vol. Ed-25, No. 2, pp. 135-139.

Seisuke Yamanaka et al.: "A Three-Chip CCD Color Camera", The Journal of the Institute of Television Engineers of Japan, vol. 33, No. 7, Jul. 1979.

Primary Examiner—Michael A. Masinick
Attorney, Agent, or Firm—Oblon, Fisher, Spivak, McClelland & Maier

[57] ABSTRACT

A plurality of photosensitive sections, each having two photosensitive rows, and a plurality of readout sections, each having two readout rows, are alternately distributed in the horizontal direction. The picture element signals of the photosensitive rows each adjacent to each of two readout rows are synthesized for each line. Pseudo-picture element signals are synthesized from the synthesized picture element signals, and the pseudo-picture element signals are used as the picture element signals corresponding to the readout sections.

9 Claims, 9 Drawing Figures

| $C_{11}$ | $\frac{C_{11}+C_{21}}{2}$ | $C_{21}$ | $C_{31}$ | $\frac{C_{31}+C_{41}}{2}$ | $C_{41}$ | $C_{51}$ |
|---|---|---|---|---|---|---|
| $C_{12}$ | $\frac{C_{12}+C_{22}}{2}$ | $C_{22}$ | $C_{32}$ | $\frac{C_{32}+C_{43}}{2}$ | $C_{42}$ | $C_{52}$ |
| $C_{13}$ | $\frac{C_{13}+C_{23}}{2}$ | $C_{23}$ | $C_{33}$ | $\frac{C_{33}+C_{43}}{2}$ | $C_{43}$ | $C_{53}$ |
| $C_{14}$ | $\frac{C_{14}+C_{24}}{2}$ | $C_{24}$ | $C_{34}$ | $\frac{C_{34}+C_{44}}{2}$ | $C_{44}$ | $C_{54}$ |

FIG. 4

| $C_{11}$ |  | $C_{21}$ | $C_{31}$ |  | $C_{41}$ | $C_{51}$ |
|---|---|---|---|---|---|---|
| $C_{12}$ | $\frac{C_{12}+C_{21}}{2}$ | $C_{22}$ | $C_{32}$ | $\frac{C_{32}+C_{41}}{2}$ | $C_{42}$ | $C_{52}$ |
| $C_{13}$ | $\frac{C_{13}+C_{22}}{2}$ | $C_{23}$ | $C_{33}$ | $\frac{C_{33}+C_{42}}{2}$ | $C_{43}$ | $C_{53}$ |
| $C_{14}$ | $\frac{C_{14}+C_{23}}{2}$ | $C_{24}$ | $C_{34}$ | $\frac{C_{34}+C_{43}}{2}$ | $C_{44}$ | $C_{54}$ |

SOLID STATE IMAGE SENSOR

BACKGROUND OF THE INVENTION

1. Field of the Invention

The present invention relates to a solid state image sensor.

2. Description of the Prior Art

In a conventional solid state image sensor such as an image sensor for a conventional interline transfer system, an electrode row of CCDs (charge coupled devices), a row of MOS capacitors and an OFD (overflow drain) are arranged alternately in the order named. One electrode, one MOS capacitor, and one OFD constitute one picture element. When such an image sensor is operated, the charged stored on the MOS capacitor is transferred to the CCD and is read out through the electrode. When the charge stored on the MOS capacitor is excessive, the extra charge is removed by the OFD. A correct image of one picture element is picked up by the functions of the electrode of the CCD, the MOS transistor and the OFD. It is known that in an image pickup device, better resolution is obtained with a greater number of picture elements. Due to this, various studies are being made for attaining an image sensor with a greater number of picture elements. However, with the conventional image sensor as described above, the electrode of the CCD, the MOS capacitor and the OFD are arranged horizontally to constitute one picture element so that it is difficult to change the pitch of the picture elements in the horizontal direction to accommodate a great number of picture elements.

SUMMARY OF THE INVENTION

It is, therefore, an object of the present invention to provide a solid state image sensor which is capable of incorporating a great number of picture elements with ease.

In order to accomplish the above and other objects, the present invention provides a solid state image sensor wherein two continuous readout rows are arranged between two rows of photosensitive cells, signals obtained from the opposing rows of photosensitive cells across the continuous readout rows are synthesized, a pseudo-image signal is formed from the synthesized signal, and the pseudo-image signal is used as the image signal corresponding to the readout rows.

BRIEF DESCRIPTION OF THE DRAWINGS

This invention can be more fully understood from the following detailed description when taken in conjunction with the accompanying drawings, in which:

FIG. 1 is a view illustrating the arrangement of the photosensitive cells, electrodes, and overflow drains of a solid state image sensor according to one embodiment of the present invention;

FIG. 2 is a view illustrating the arrangement of the picture elements when the image sensor shown in FIG. 1 is used as a monochrome camera;

FIG. 3 is a view illustrating the case wherein non-photosensitive picture elements of FIG. 2 are transformed into pseudo-photosensitive picture elements;

FIG. 4 is a view illustrating the pseudo-photosensitive picture elements according to another modification of the present invention;

DETAILED DESCRIPTION OF THE PREFERRED EMBODIMENTS

Figures 1, 2:
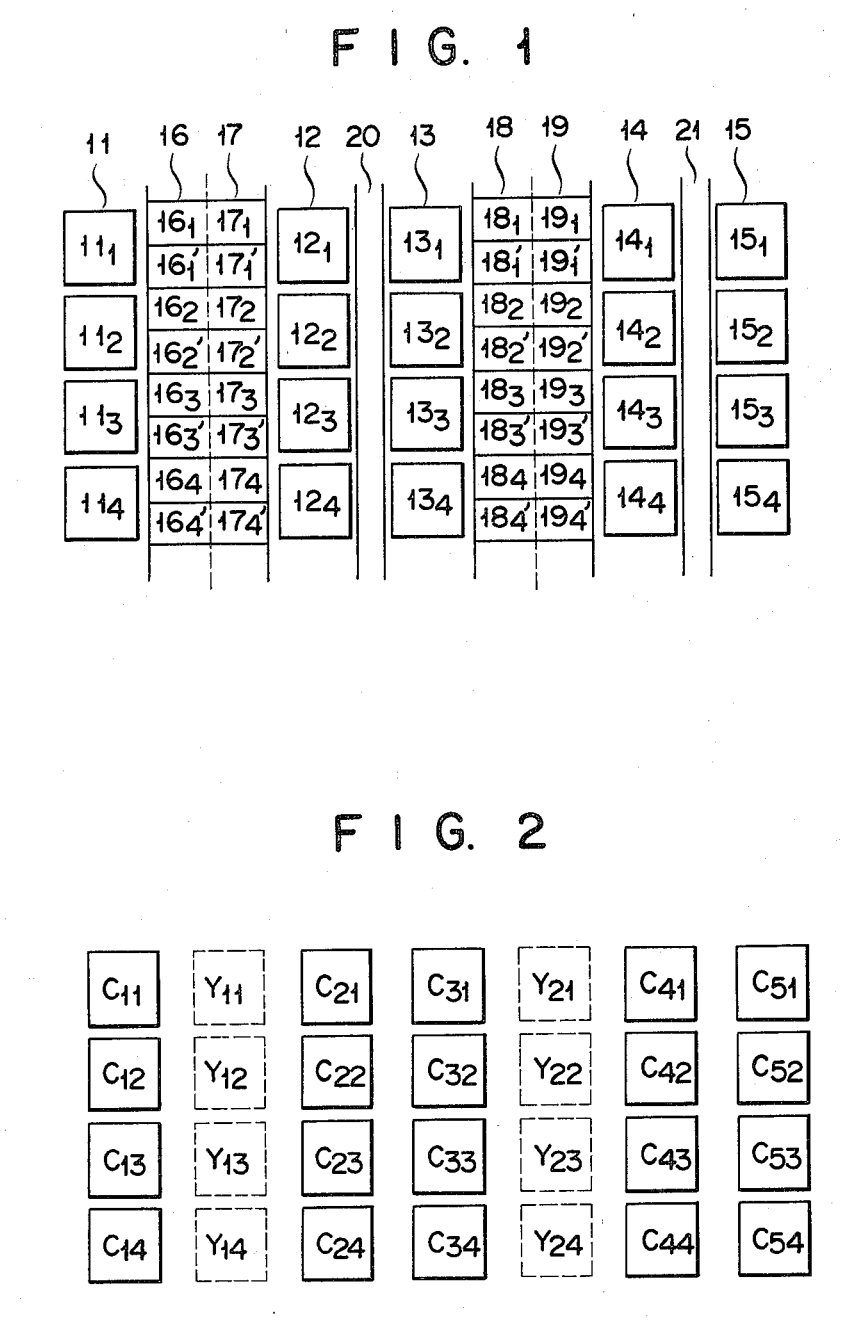
Figure 5:
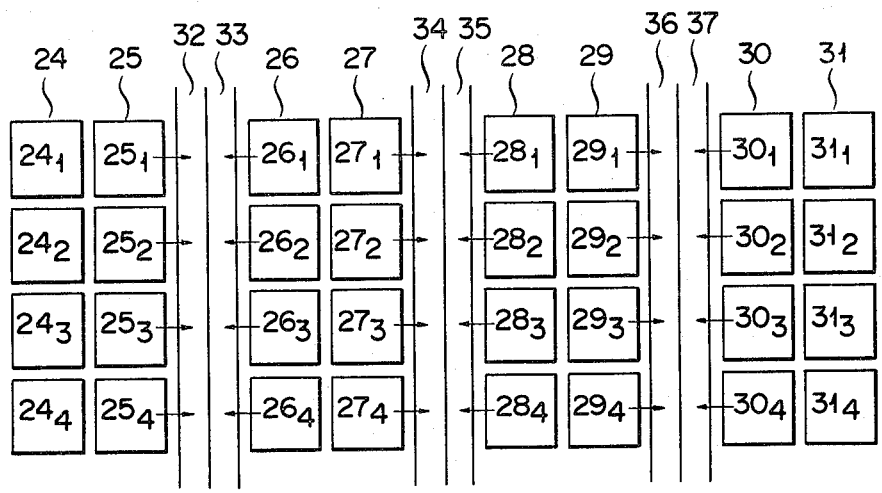
FIG. 5 is a view illustrating the arrangement of the photosensitive cells and electrodes of an image sensor according to another embodiment of the present invention.

In the solid state image sensor shown in FIG. 1, a plurality of rows of photosensitive cells, for example, rows 11, 12, 13, 14 and 15 of MOS capacitors, are horizontally distributed. These rows 11 to 15 of MOS capacitors respectively have MOS transistors $11_1$ to $11_4$, $12_1$ to $12_4$, $13_1$ to $13_4$, $14_1$ to $14_4$ and $15_1$ to $15_4$. Two rows 16 and 17 of continuous CCDs are arranged between the rows 11 and 12 of MOS capacitors, and rows 18 and 19 of CCDs are similarly arranged between the rows 13 and 14 of MOS capacitors. These rows 16 to 19 of CCDs, respectively, have electrodes $16_1$ to $16_4'$, $17_1$ to $17_4'$, $18_1$ to $18_4'$ and $19_1$ to $19_4'$. An overflow drain (OFD) 20 is interposed between the adjacent rows 12 and 13 of MOS capacitors, and an OFD 21 is similarly interposed between the rows 14 and 15 of MOS capacitors.

With the above construction, the MOS capacitors $11_1$ to $11_4$, $12_1$ to $12_4$, $13_1$ to $13_4$, $14_1$ to $14_4$ and $15_1$ to $15_4$ each constitute picture elements. The rows 16 to 19 of CCDs each constitute readout rows and provide non-photosensitive parts. When such an image pickup device is used in a monochrome camera, the picture element arrangement becomes as shown in FIG. 2. Referring to FIG. 2, picture elements C11 to C14 respectively correspond to the MOS capacitors $11_1$ to $11_4$. Similarly, picture elements C21 to C24, C31 to C34, C41 to C44 and C51 to C54 respectively correspond to the MOS capacitors $12_1$ to $12_4$, $13_1$ to $13_4$, $14_1$ to $14_4$ and $15_1$ to $15_4$. Non-picture elements Y11 to Y14 and Y21 to Y24 respectively correspond to the rows 16 and 17, and 18 and 19 of CCDs which are not photosensitive. The gist of the present invention is that the non-picture elements Y11 to Y14 and Y21 to Y24 in use are transformed into pseudo-picture elements. When image pickup is performed by an interline transfer image pickup system with the image sensor, the charges stored on the MOS capacitors $11_1$, $11_3$; $12_1$, $12_3$; $13_1$, $13_3$; $14_1$, $14_3$; and $15_1$, $15_3$ at the first field are transferred to the rows 16, 17, 18 and 19 of CCDs and are read out as picture element signals by electrodes $16_1$ to $16_4'$, $17_1$ to $17_4'$, $18_1$ to $18_4'$ and $19_1$ to $19_4'$. Similarly, in the second field, the charges stored on the MOS capacitors $11_2$, $11_4$, $12_2$, $12_4$, $13_2$, $13_4$, $14_2$, $14_4$, $15_2$ and $15_4$ are read out as picture element signals by the rows 16, 17, 18 and 19 of the CCDs. The readout picture element signals are transferred to a signal processing circuit. This signal processing circuit performs the following picture signal processing. A picture element signal of the non-picture element Y11 is produced from the picture signals of the picture elements C11 and C21. In this case, the signal of Y11 is obtained from the relation: $Y_{11} = [(C11 + C21)/2]$. That is, the picture element signal of the non-picture element Y11 is obtained as the mean value of the picture signals of the picture elements C11 and C21. Thus, the non-picture element $Y_{11}$ is transformed into a picture element. Similarly, the non-picture elements Y12 to Y14 and Y21 to Y24 are transformed into picture elements. FIG. 3 shows the condition in which all are picture elements.

As has been described above, two rows of CCDs are arranged continuously, and the rows of MOS capacitors are arranged to sandwich them. An OFD is interposed between every pair of adjacent rows of MOS capacitors, so that only one OFD is required for two picture elements. Due to this, a higher packing density in the horizontal direction is obtained and a greater number of picture elements may be incorporated. Further, since a picture element signal for a non-picture element is obtained from picture element signals of two picture elements, resolution may be improved.

In the above embodiment, the transformation of the non-picture elements into picture elements is accomplished based on the picture element signals of opposing picture elements across the electrodes of the continuous CCDs. However, it is also possible to obtain, across the electrodes of the continuous CCDs, a picture element signal for the non-picture element from the picture element signals of picture elements which oppose each other obliquely, as shown in FIG. 4.

Another embodiment of the present invention will now be described with reference to FIG. 5. This embodiment uses resistive gate CTDs. Such a resistive gate CTD is disclosed in "The Resistive Gate CTD Area-Image Sensor", M. Heyns et al, IEEE Trans. on Electron Device Vol. ED-25 No. 2, pp. 135-139. According to this embodiment, pairs of photosensitive cells rows 24, 25; 26, 27; 28, 29; and 30, 31 are distributed horizontally. Paired electrodes 32, 33; 34, 35; and 36, 37 are respectively interposed between these pairs of photosensitive cell rows. These electrodes 32 to 37 may, for example, comprise resistive electrodes of polycrystalline silicon. Picture element signals from the photosensitive cells of the photosensitive cell rows 25, 26; 27, 28; and 29, 30 each adjacent to the paired resistive electrodes 32, 33; 24, 35; and 36, 37, are synthesized to produce pseudo-picture element signals at the electrode regions. This results in the greater number of picture elements, and the resolution in the horizontal direction is improved.

Figure 6:
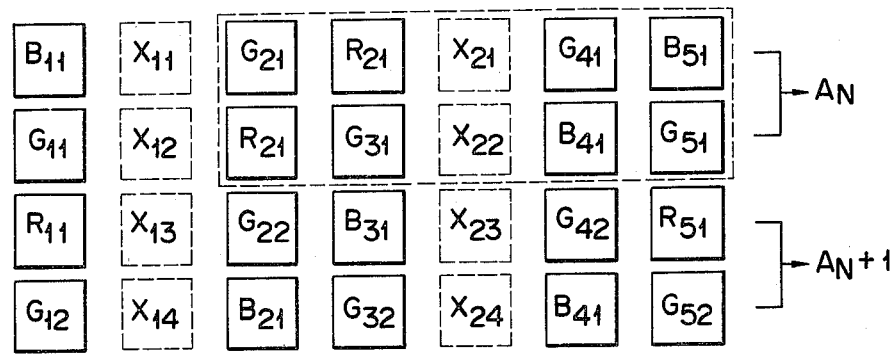
FIG. 6 is a view illustrating the arrangement of the picture elements when the image sensor of FIG. 1 is used as a color camera.

The description has been made with respect to a case wherein the image sensor of the present invention is applied to a monochrome camera. A case will now be described wherein the image sensor is applied to a color camera. In the case of a color camera, to the photosensitive cells, that is, the MOS capacitors $11_1$ to $11_4$, $12_1$ to $12_4$, $13_1$ to $13_4$, $14_1$ to $14_4$ and $15_1$ to $15_4$ shown in FIG. 1, are adhered red filters (R11, R21, R31), green filters (G11, G12, G21, G22, G31, G32), and blue filters (B11, B21, B31, B41) as shown in FIG. 6. As a method for adhering these filters, one method is disclosed in "Experimental Study on CCD signal Plate Color Cameras", Television Association Bulletin, July 1979 edition, pp. 530–535. According to this method, one filter is adhered to two continuous MOS capacitors. The arrangement region of FIG. 1 corresponds to the region of two lines, i.e., AN. Describing the region surrounded by the alternate long and short dashed lines of FIG. 6, the filter G21 is provided for the MOS capacitors $12_1$ and $12_2$, and the filter R21 is provided for the MOS capacitors $12_3$ and $12_4$. The other filters R21, G31, G41, B41, and G51, are arranged in a similar manner. X11 to X14, X21 to X24, and X31 to X34 correspond to the rows 16 to 19 of electrodes which are non-photosensitive parts.

Figure 7:
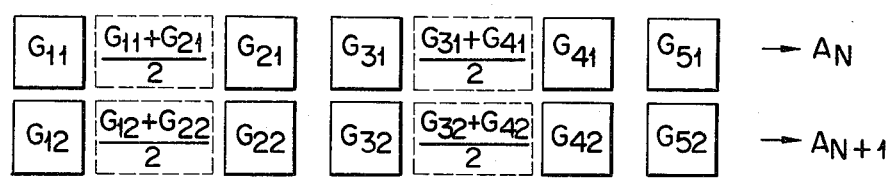
FIG. 7 is a view illustrating the case wherein the non-photosensitive picture elements of FIG. 6 are transformed into pseudo-photosensitive picture elements.

When the color filters are adhered to the photosensitive cells as described above, two lines of signal charge are simultaneously read out as a signal AN. Since green is perceived by the human eye as the color of best resolution in the case of the single plate type color camera, picture elements of green are provided in great number. Thus, according to the present invention, pseudo-signals of green are produced for the non-photosensitive parts X11 to X34 for making the number of green picture elements greater. When a signal of green is obtained from the signal AN corresponding to the two lines shown in FIG. 6, a pseudo-signal of green corresponding to the non-photosensitive parts X11 and X12 is obtained as (G11+G12)/2. Signals (G12+G22)/2; (G31+G41)/2; and (G32+G42)/2 are obained from the non-photosensitive parts X13, X14; X21, X22; and X23, X24. The resolution in the horizontal direction is improved by obtaining these pseudo-signals of green. FIG. 7 shows the picture element pattern of picture elements having pseudo-signals of green.

Figure 8:
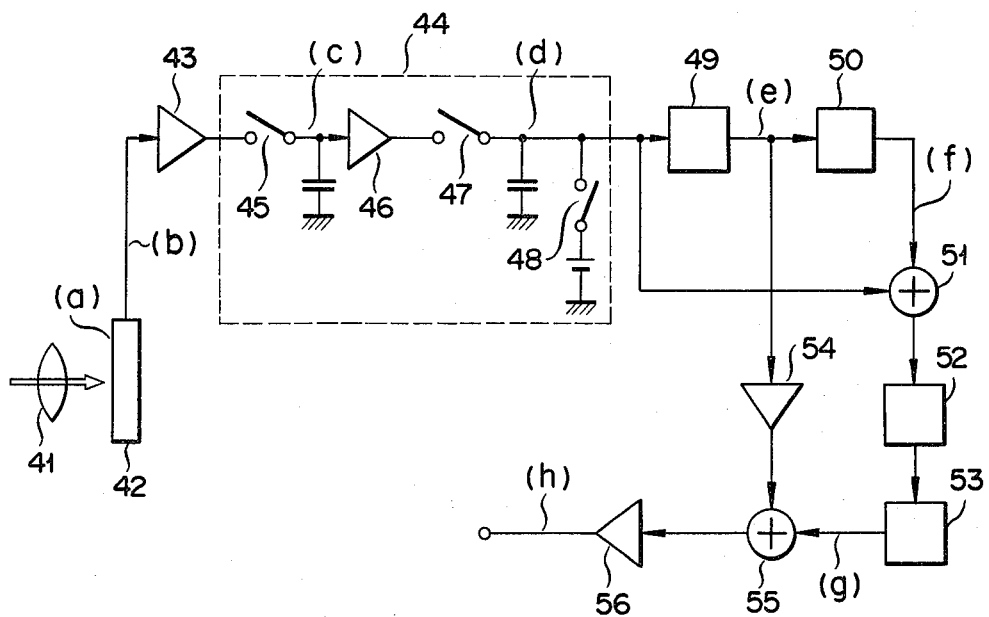
FIG. 8 is a circuit diagram of a signal processing circuit.
Figure 9:
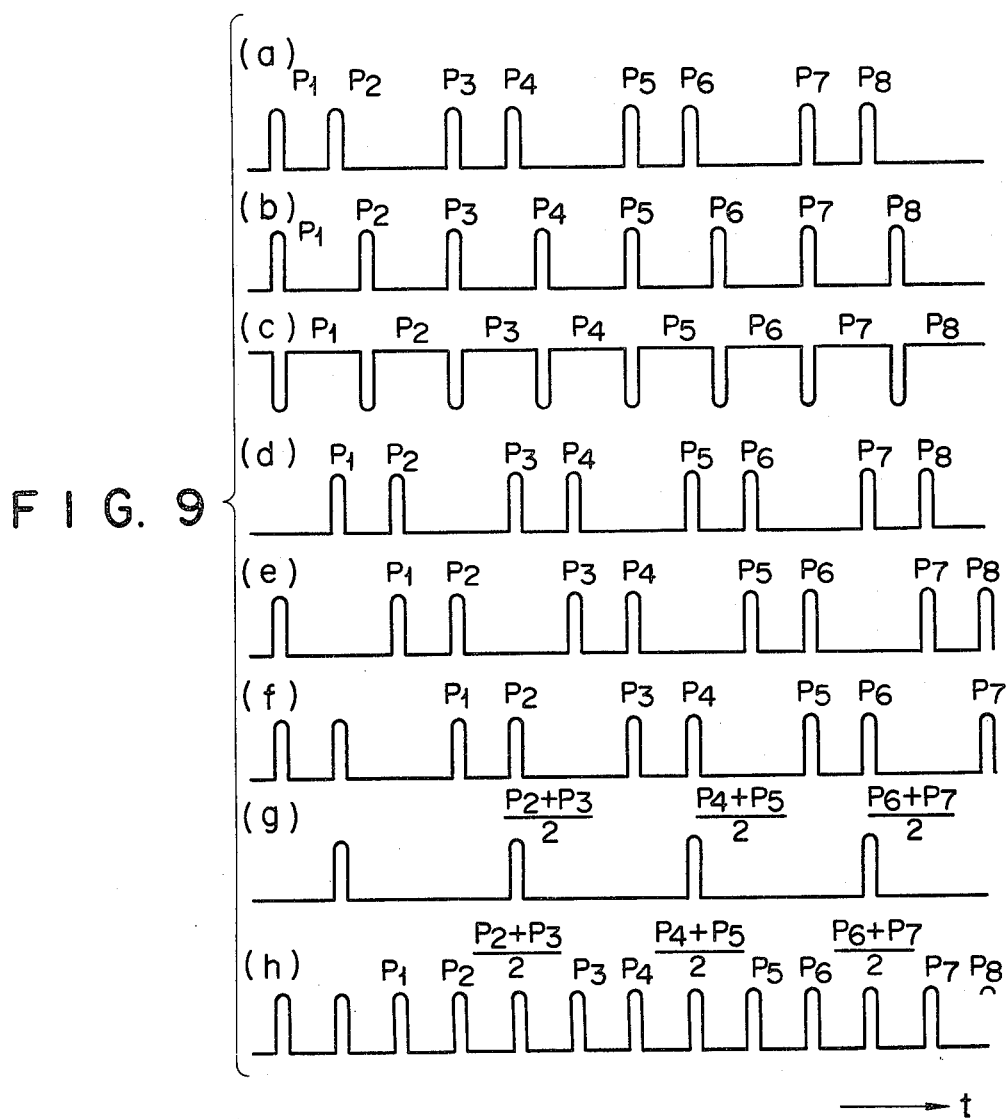
FIG. 9 is a timing chart of the signals obtained from the signal processing circuit of FIG. 8.

Signal processing for producing the pseudo-signals described above will be described referring to the signal processing circuit shown in FIG. 8. Referring to FIG. 8, when a CCD 42 is exposed to light through a lens 41, picture element signals corresponding to the arrangement of the MOS capacitors $11_1$ to $15_1$ shown in FIG. 1 are produced. The picture element signals, when read out directly, take the form of a signal a as shown in FIG. 9. Thus, the respective pairs of signals, i.e., P1, P2; P3, P4; P5, P6; and P7, P8 are paired, and each pair is spaced apart from the next pair by a distance greater than the distance between the paired signals. This signal a is outputted as a continuous signal b of constant period from the CCD 42 by the timing control of a readout drive pulse which is input to the CCD 42. When the signal b is supplied to a signal correcting circuit 44 through an amplifier 43, the signal b is converted into a signal c of long effective image period by a sampling and holding circuit 45 of the signal correcting circuit 44. When this signal c is supplied to a sampling and holding circuit 47 through an amplifier 46, the signal c is converted into a signal d by the sampling and holding circuit 47 associated with a gate circuit 48. In this signal d, the distance between each pair of image signals P1, P2; P3, P4; P5, P6; and P7, P8 becomes about twice the distance between the two signals of each pair. When the signal d is input to a delay circuit 49, the signal d is delayed by one picture element by the delay circuit 49. A delay image signal e from the delay circuit 49 is input to a delay circuit 50 and is delayed by one picture element. A signal f from the delay circuit 50 is input to an adder 51 and is added to the signal d. The output signal of the adder 51 is input to a signal extraction circuit 52, and a signal converter by the addition to high level is extracted. The extracted signal is amplitude-adjusted by an amplitude adjusting circuit 53 and is outputted from the amplitude adjusting circuit 53 as a signal g. This signal g is outputted to an adder 55 and is added to the signal e which is provided through an amplifier 54. When this signal g is added to the signal e, the pseudo-picture element signals, (P2+P3)/2, (P4+P5)/2, (P6+P7)/2 are inserted at signal intervals in correspondence to the non-photosensitive parts. The added signal is amplified by an amplifier 55 and is inputted as an image signal to a monitoring TV, for example.

According to the present invention, a plurality of readout sections, each having two readout rows, and a plurality of photosensitive sections, each having two photosensitive cells rows, are alternately distributed in the horizontal direction. An overflow drain (OFD) is interposed between each pair of photosensitive cell rows of the photosensitive sections. Accordingly, the number of the OFDs may be reduced, and the number of picture elements in the horizontal direction may be increased. Pseudo-picture element signals are synthesized from the picture element signals the photosensitive cell rows located at both sides of the readout sections. These pseudo-picture element signals are used as the image signals for the readout sections, that is, the non-photosensitive parts. Thus, advantageous effects due to the increase in the number of picture elements are obtained, and the resolution may be improved.

In the above embodiment, the frame storing mode was employed according to which transfer is performed separately for the two fields when transferring the signal charges stored on the MOS capacitors to the CCDs. This transfer, however, may be performed according to the field storing mode. Although a single plate system is employed in the color pickup, color pickup of high resolution may be attained by using a three plate system and performing the same signal processing for red (R), green (G), and blue (B). When a space picture element shift pickup system is also employed with the three plate system, a still higher resolution may be attained. The space picture element shift pickup system is disclosed in "One System for the 3CCD Color Camera", Television Association Bulletin, July 1979 edition, pp. 516–522. In the case of the single plate color pickup, complementary color filters may be used in place of the R, G, and B color filters. Although MOS capacitors were used as the photosensitive cells, p-n junctions may be used.

What we claim is:

1. A solid state image sensor comprising:
 a plurality of photosensitive sections each having two photosensitive rows formed of a plurality of photosensitive elements for generating picture element signals;
 a plurality of readout sections alternately arranged with said photosensitive sections, and each having two readout rows formed of a plurality of readout elements for reading out picture element signals;
 overflow drains interposed between said two photosensitive rows of said photosensitive sections; and
 a signal processing circuit for processing picture element signals obtained from said photosensitive elements of said photosensitive rows each adjacent to one of said two readout rows of said readout sections so as to produce pseudo-picture element signals, and for processing said pseudo-picture element signals as image signals corresponding to said readout sections.

2. A solid state image sensor according to claim 1, wherein said signal processing circuit comprises means for synthesizing said picture element signals from two opposing elements among said photosensitive elements of said photosensitive rows each adjacent to each of said two readout rows so as to produce synthesized signals, and means for producing said pseudo-picture element signals from said synthesized signals.

3. A solid state image sensor according to claim 2, wherein said two opposing elements of said means for synthesizing said picture element signals are arranged along the same line.

4. A solid state image sensor according to claim 2, wherein said two opposing elements of said means for synthesizing said picture element signals are diagonally arranged shifted by one picture element.

5. A solid state image sensor according to claim 1, wherein color filters of red, green, and blue are adhered to said photosensitive elements, color signals of red, green and blue corresponding to the colors of said filters are generated by said photosensitive elements to which said color filters are adhered, and said color signals are read out by said readout sections and are processed by said signal processing circuit.

6. A solid state image sensor according to any one of claims 1 to 5, wherein said signal processing circuit comprises means for sampling green signals, means for synthesizing said green signals to produce synthesized signals, and means for producing pseudo-green signals from said synthesized signals.

7. A solid state image sensor according to any one of claims 1 to 6, wherein said photosensitive elements comprise MOS capacitors.

8. A solid state image sensor according to any one of claims 1 to 6, wherein said readout sections comprise charge-coupled devices.

9. A solid state image sensor according to any one of claim 1 to 6, wherein said readout sections have resistive electrodes.

* * * * *